(12) United States Patent
van Poppel

(10) Patent No.: US 6,384,518 B1
(45) Date of Patent: May 7, 2002

(54) PIEZOELECTRIC COUPLER FOR VARIABLY COUPLING TWO BODIES AND JOINT INCORPORATING THE COUPLER

(76) Inventor: Jean A. van Poppel, 135 Croswell, Romeo, MI (US) 48065

( * ) Notice: Subject to any disclaimer, the term of this patent is extended or adjusted under 35 U.S.C. 154(b) by 0 days.

(21) Appl. No.: 09/663,762

(22) Filed: Sep. 18, 2000

(51) Int. Cl.[7] .......................... H01L 41/04; H01L 41/08; H01L 41/053; H01L 41/083; H02M 2/00; H02M 2/06

(52) U.S. Cl. .................. 310/369; 310/367; 310/365; 310/311

(58) Field of Search ................. 333/175, 153; 356/460; 310/328, 369, 313 D, 318, 322, 313 R, 313 B; 385/37, 31, 16

(56) References Cited

U.S. PATENT DOCUMENTS

| | | | |
|---|---|---|---|
| 3,129,798 A | 4/1964 | Rabinow | 192/84 |
| 3,147,835 A | 9/1964 | Thomas | 192/84 |
| 3,982,144 A * | 9/1976 | Rogers et al. | 310/9.6 |
| 4,019,073 A * | 4/1977 | Vishnesvsky et al. | 310/8.2 |
| 4,519,751 A * | 5/1985 | Beckman et al. | 417/322 |
| 4,593,956 A * | 6/1986 | Caruso et al. | 384/1 |
| 4,789,240 A * | 12/1988 | Bush | 356/345 |
| 5,039,900 A | 8/1991 | Nashiki et al. | 310/328 |
| 5,229,980 A * | 7/1993 | Pawela | 367/157 |
| 5,493,623 A * | 2/1996 | Frische et al. | 385/12 |
| 5,678,672 A | 10/1997 | Sudau | 192/84.1 |
| 5,735,811 A * | 4/1998 | Brisken | 604/22 |
| 5,742,562 A * | 4/1998 | Marschall et al. | 367/188 |
| 5,744,799 A * | 4/1998 | Ohara | 250/306 |
| 6,020,674 A * | 2/2000 | Zhang et al. | 310/333 |
| 6,242,849 B1 * | 6/2001 | Burov et al. | 310/328 |

OTHER PUBLICATIONS

David Henderson, John C. Fasick, "Inchworm® Motor Developments for the Next Generation Space Telescope (NGST)", 5 pages, publishing date unknown.
Michael Gogola, Michael Goldfarb, "Design of a PZT Actuated Proportional Drum Brake", version Jun. 15, 1999, 19 pages, publishing date unknown.

* cited by examiner

Primary Examiner—Karl Tamai
Assistant Examiner—Julio C. Gonzalez
(74) Attorney, Agent, or Firm—Thomas Hooker, P.C.

(57) ABSTRACT

A controlled collapse joint includes a piezoelectric coupler that frictionally couples two bodies. The coupler includes concentric inner and outer members mounted for relative motion on cooperating bearing surfaces. The two surfaces engage each other with an interference fit that resists relative motion and frictionally couples the members. One of the surfaces is formed on a piezoelectric component that moves towards or away the other surface when a voltage difference is applied to the piezoelectric component. The coupling of the two members is adjustable by varying the applied voltage difference to increase or decrease the interference fit between the piezoelectric component and the other member.

23 Claims, 4 Drawing Sheets

PIEZOELECTRIC COUPLER FOR VARIABLY COUPLING TWO BODIES AND JOINT INCORPORATING THE COUPLER

FIELD OF THE INVENTION

The present invention relates to a piezoelectric coupler for selectively coupling two bodies and a joint incorporating the coupler.

BACKGROUND OF THE INVENTION

Piezoelectric material has a crystalline structure that axially expands or contracts when a voltage difference is applied along the axis. Whether the material expands or contracts depends on the polarity of the voltage difference. For example, a positive voltage difference may cause the material to expand and a negative voltage difference may cause the material to contract. The greater the voltage difference, the greater the deformation. When the voltage difference is removed the structure returns to its initial undeformed state.

Devices that utilize the ability of piezoelectric materials to selectively expand or contract are known. Such devices may form couplers or joints that selectively couple or join two bodies. The device is attached to one body. The piezoelectric material expands and extends to engage the other body and couple the two bodies together. The material contracts to uncouple the two bodies. The expansion or contraction of the piezoelectric material can be finely controlled by varying the applied voltage difference.

In one known type of piezoelectric device a number of piezoelectric elements are stacked together to form an element stack having an initial stack height. The elements are each connected to electrodes that apply a voltage difference from a voltage source to opposite sides of the element. The voltage difference increases the height of each element and so the overall stack height increases. The stack height is controlled by varying the voltage difference. The stack extends to engage the end of the stack against the other member and apply a coupling force to the other member.

Piezoelectric stacks have a number of disadvantages that often render them unsuitable for joining or coupling two bodies. The large number of electrodes requires complicated and expensive wiring. The element stack must be supported in a housing, with the electrodes and wiring contained in the housing. Such an assembly is heavy and takes up a large amount of space. The stack force is applied over a small area and often a number of stacks must operate simultaneously to apply sufficient coupling force.

Thus, there is a need for an improved piezoelectric coupler for selectively coupling two bodies. The improved coupler should be compact and lightweight. The coupler should apply a coupling force over a large area, and should be simple to install and not require extensive wiring.

SUMMARY OF THE INVENTION

The present invention is directed to an improved coupler for coupling two bodies. The coupling force is applied over a relatively large area. The coupler is compact, lightweight and does not require extensive wiring. Structural elements and actuator elements of the coupler are incorporated in a self contained, integrated unit.

A coupler having features of the present invention includes an outer member mounted about an inner member for relative motion on mutually engaged concentric bearing surfaces. The two members are assembled together such that the surfaces engage each other with an interference fit that resists relative motion and frictionally couples the members.

One member includes a piezoelectric component having inner and outer walls. The surface of the one member is located on an inner or outer wall of the piezoelectric component. The surface on the piezoelectric component moves towards or away from the other surface when a voltage difference is applied across the inner and outer walls of the piezoelectric component and increases or decreases the interference fit. The frictional coupling of the two members is selectively controlled by varying the voltage difference applied across the walls of the piezoelectric component to increase or decrease the interference fit between the two surfaces.

The coupling force is generated over a relatively large surface area and efficiently couples the members. Only one piezoelectric component is needed to couple the two bodies and so the coupler is lightweight, compact and easily wired to a voltage source.

In possible embodiments of the present invention, only two electrodes are required to wire the piezoelectric component to a voltage source. One electrode is electrically connected to the component outer wall and the other electrode is electrically connected to the component inner wall. The need to wire a large number of piezoelectric bodies is eliminated and the weight of the coupling is reduced.

In particularly advantageous embodiments, the other member is formed from an electrically conductive material, such as steel. The conductive material forms part of the electrical connection between the wall of the piezoelectric component engaging the conductive member and a terminal of a voltage source. This allows an electrode to be easily attached to an exposed surface of the conductive member.

In preferred embodiments of the present invention the piezoelectric component forms a portion of the inner member. The outer member presses inwardly and compresses the piezoelectric component. Conventional piezoelectric materials are stronger in compression than in tension, and so it is mechanically advantageous to have the piezoelectric component inside the outer member. However, if the piezoelectric material is sufficiently strong in tension, the piezoelectric component could form the outer member. In such embodiments the interference fit could tension the piezoelectric component.

In an advantageous embodiment of the present invention, the coupler forms a portion of a controlled collapse joint that varies the coupling between two bodies in response to some triggering event. The outer member is connected to one body and the inner member is connected to the other body. The joint enables the controlled coupling of one body with respect to the other body in response to external events to advantageously regulate the coupling of the two bodies during the event.

The piezoelectric component is a piezoelectric cylinder that forms a portion of the inner member. The outer member is a steel cylinder mounted on the piezoelectric cylinder for rotation, translation or combined rotation and translation about or along the piezoelectric cylinder. The outer and inner walls of the piezoelectric cylinder are electrically connected to a variable voltage system that forms a portion of a control system that actively controls the coupling of the coupler.

The control system includes a computer that controls the output of the voltage source and a sensor that transmits data to the computer enabling the computer to resolve the triggering event. The computer varies the coupling of the two bodies in response to the triggering event.

Other objects and features of the invention will become apparent as the description proceeds, especially when taken in conjunction with the accompanying drawings illustrating the invention, of which there are four sheets of drawings and two embodiments.

DESCRIPTION OF THE PREFERRED EMBODIMENT

Figure 1:
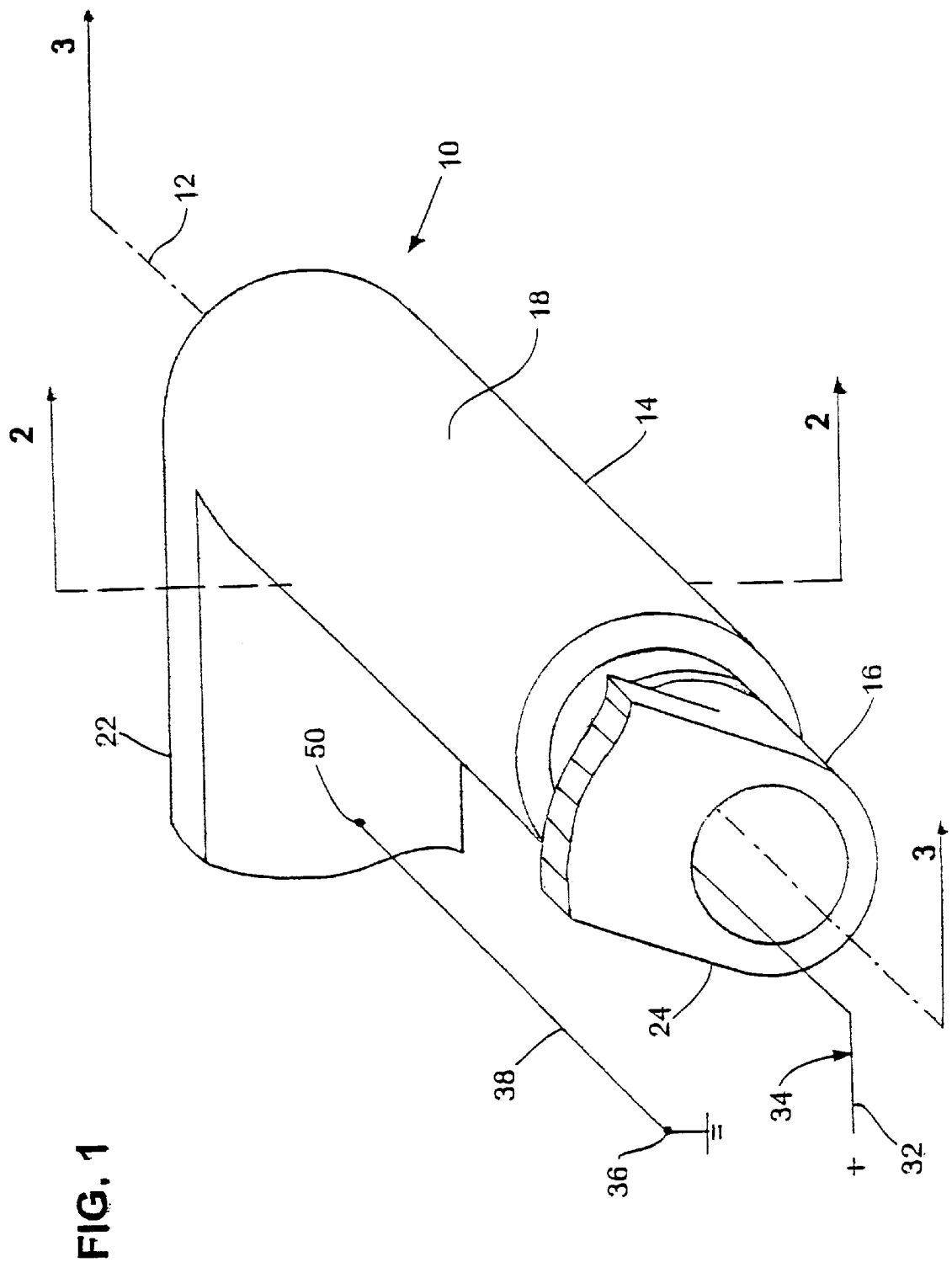
FIG. 1 is a perspective view of a piezoelectric coupler made in accordance with the present invention.
Figure 2:
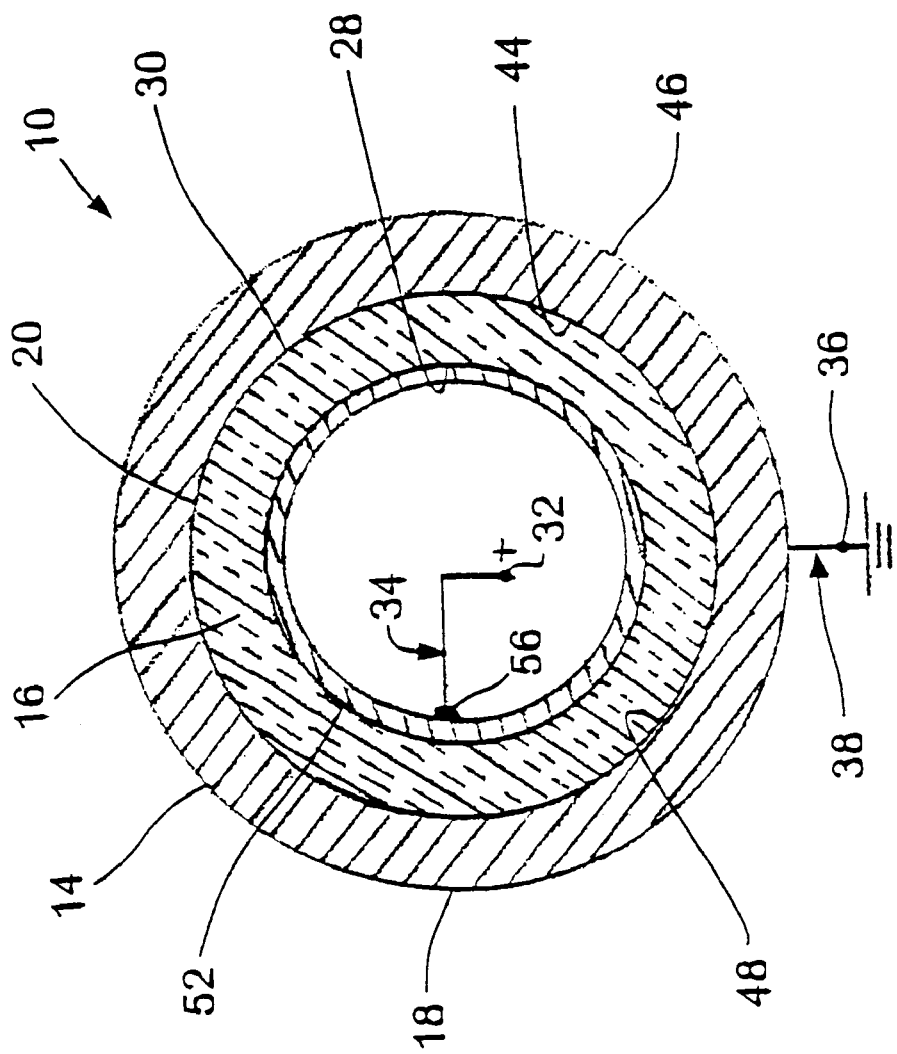
FIG. 2 is a sectional view of the piezoelectric coupler taken along line 2—2 of FIG. 1.
Figure 3:
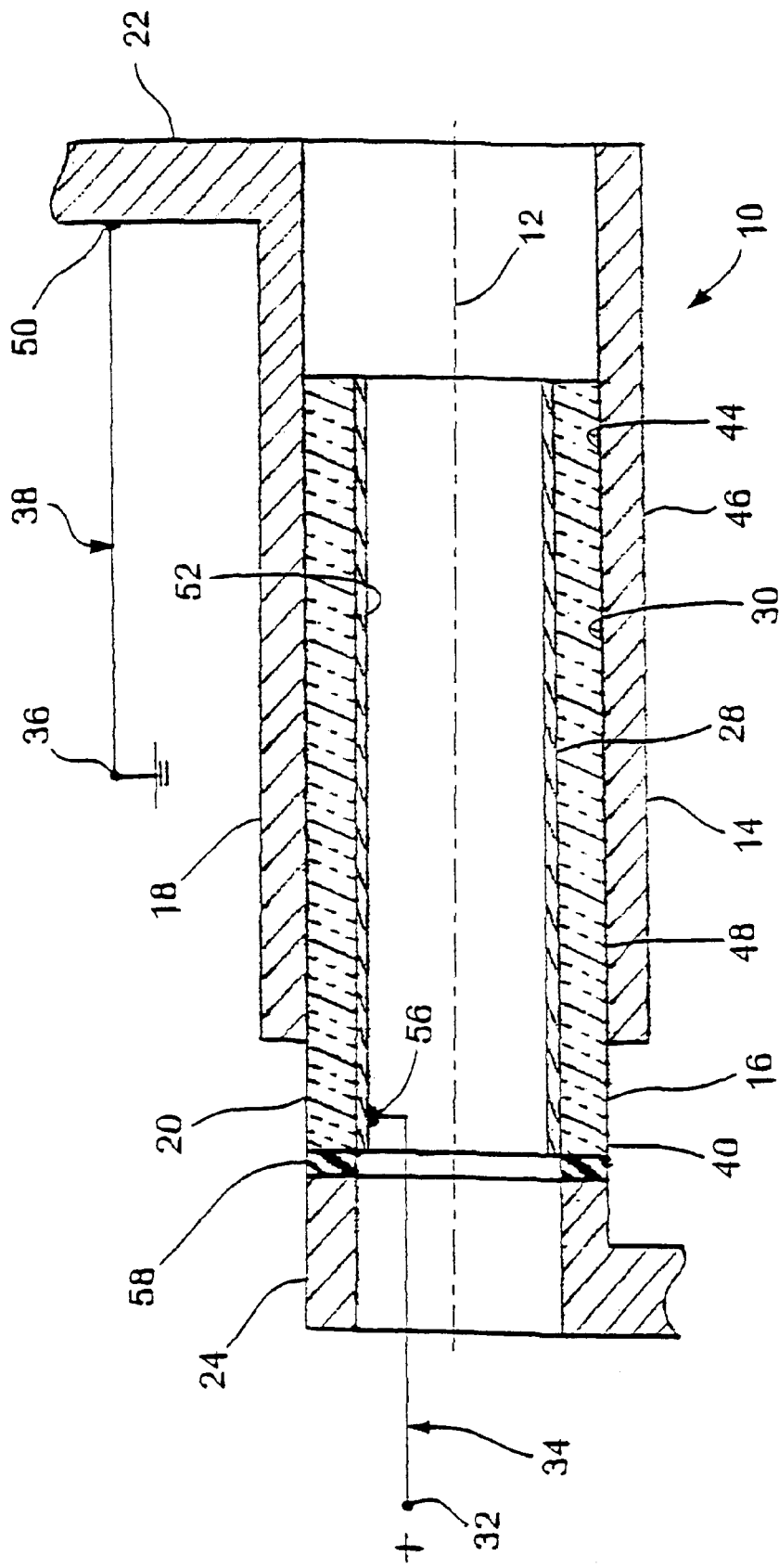
FIG. 3 is a sectional view of the piezoelectric coupler taken along line 3—3 of FIG. 1.

FIGS. 1–3 illustrate a piezoelectric coupler 10 made in accordance with the present invention. The coupler 10 couples two bodies about an axis of rotation 12.

The coupler 10 includes concentric outer and inner members 14 and 16 respectively that extend along the axis of rotation 12. The outer member 14 includes a cylindrical body 18 that is assembled over a cylindrical body 20 of the inner member 16 for rotation about the axis 12. The outer body 18 is electrically conductive and may be made of steel. The cylindrical bodies 18, 20 are assembled with an initial interference fit. The outer member 14 is nonrotably connected to a first body by an arm 22 located on one end of the joint 10 for conjoint rotation about the axis 12. The inner member 16 is nonrotatably attached to a second body by a second arm 24 located on the other end of the joint 10.

The inner cylindrical body 20 is a cylinder formed from piezoelectric material. The piezoelectric cylinder 20 has an inner cylinder wall 28 and an outer cylinder wall 30 separated by the radial thickness of the cylinder. In operation, the inner wall 28 is electrically connected to a positive terminal 32 of a voltage source by a first electrical connection 34. The outer wall 30 is electrically connected to a ground terminal 36 of a voltage source by a second electrical connection 38.

The piezoelectric cylinder 20 extends from one end of the outer cylindrical body 18 to a free end 40 adjacent the second arm 24. The end 40 of the piezoelectric cylinder may include conventional structure (not shown) such as teeth or splines formed on the end of the piezoelectric cylinder 20 to connect the piezoelectric cylinder with the second arm.

The outer member 14 has the first arm 22 integrally formed with the cylindrical body 18. The cylindrical body 18 has inner and outer cylindrical walls 44 and 46 respectively separated by the radial thickness of the body 18. When unassembled, the diameter of the inner wall 44 is slightly less than the diameter of the outer wall 30 of the piezoelectric cylinder 20. When assembled, the facing inner and outer walls 44, 30 engage each other to form an initial interference fit. The walls press against each other with a mutual contact pressure along a common cylindrical interface 48.

The mutual contact pressure of the two cylindrical walls 44, 30 electrically connects the outer member 14 with the outer wall 30 of the piezoelectric cylinder 20 and forms a portion of the second electrical connection 38. The electrical connection 38 includes an electrode 50 fastened to the outside of the outer member 14 for connection to the ground terminal 36.

The first electrical connection 34 includes a thin cylindrical conductor or conductive film 52 bonded to the inner wall 28 of the piezoelectric cylinder 20 by an electrically conducting bonding agent. The bonding agent electrically connects the film 52 with the inner wall 28. Second electrode 56 is attached to an exposed surface of the film 52 for connection to the positive terminal 32.

Each of the mechanical connections may include electrical insulation that insulates the bodies attached to the members 14 and 16 from the electrodes 50, 56. In this embodiment the body attached to the inner member 16 is insulated by insulation 58 at the end 40 of the piezoelectric cylinder 20.

Figure 4:
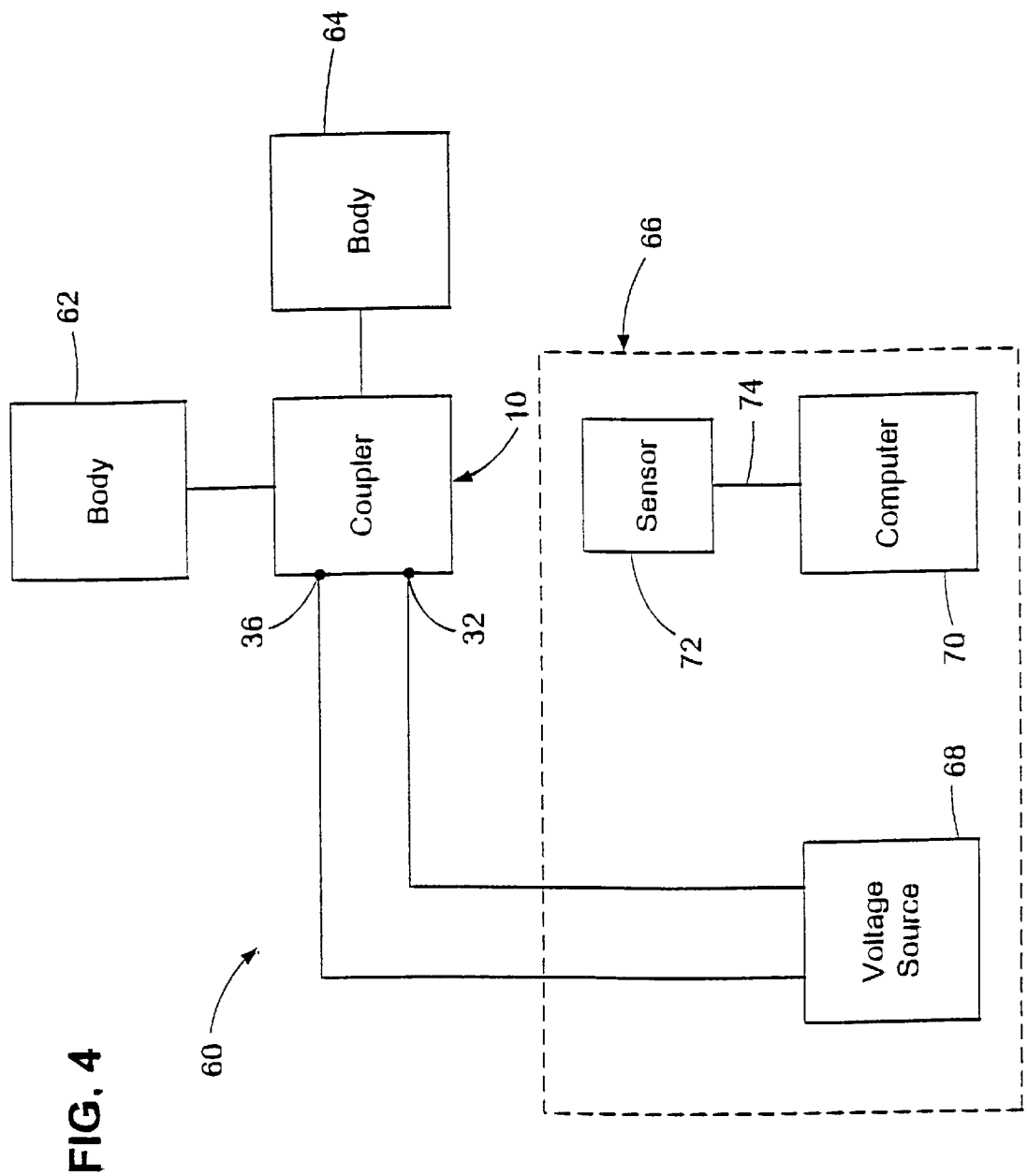
FIG. 4 illustrates a controlled collapse joint incorporating the piezoelectric coupler shown in FIG. 1.

FIG. 4 illustrates a controlled collapse joint 60 incorporating the coupler 10. The controlled collapse joint 60 acts to control the relative rotation of a movable body 62 about a stationary body 64. The movable body 62 is nonrotatably attached to arm 22 of the outer member 14 for conjoint rotation about the axis 12. The stationary body 64 is nonrotatably attached to arm 24 of the inner member 16.

The joint 60 includes a control system 66 operatively connected to a variable voltage source 68 having terminals 32 and 36. The terminals 32, 36 are wired to the electrodes 56 and 50 respectively. The control system 66 includes a computer 70 operatively connected to the voltage source 68. The computer 70 selectively varies the coupling of coupler 10 in response to some triggering event.

In this embodiment, the control system 66 responds to an impact against the movable body 62 and includes a proximity sensor 72 operatively connected between the two members 14, 16 and the computer 70. The sensor 72 transmits a data signal 74 to the computer 70 corresponding to the angular position of the outer member 14 with respect to the inner member 16. The data signal 74 enables the computer 70 to detect relative motion of the movable body 62 from an impact and calculate the speed and position of the body during the impact.

Operation of the controlled collapse joint 60 will now be described. The coupling of the two bodies by the coupler 10 is varied by the control system by varying the interference fit between the members 14, 16. The joint 60 enables controlled deceleration or braking of the movable body 62 and yet minimizes the force of the impact against the body. The computer 70 monitors the motion of the movable body 62 and brakes the body in a controlled manner to prevent the impact forces acting on the body from exceeding acceptable levels.

The control system 66 can respond to impacts in one of two operating modes. In the first mode, the coupling of the two bodies 62, 64 by coupler 10 is increased during the impact to increase resistance to motion. The increased coupling more quickly brakes the movable body 62 and can decelerate the body in a controlled manner. In the second mode, the coupling of the two bodies 62, 64 by coupler 10 is decreased during impact to reduce resistance to motion. The reduced coupling enables the movable body 62 to rotate more easily during impact and reduces the impact force acting on the body.

The coupling of the two bodies by the coupler 10 is initially set by the control system 66 to prevent rotation of the outer member 14 about the inner member 16 during normal operating conditions. The control system 66 directs the voltage source 68 to generate a predetermined voltage difference across terminals 32, 36. The voltage difference is applied by the electrical connections 34 and 38 to the inner and outer cylinder walls of the piezoelectric cylinder 20. The piezoelectric cylinder 20 attempts to radially expand in response to the applied voltage difference. Expansion of the piezoelectric cylinder 20 is opposed by the cylindrical body 18 of the outer member 14. The interference between the two members at the interface 48 increases above the initial interference fit to an operating interference fit. The contact pressure at the interface 48 increases and friction between the members 14, 16 more tightly couples the members together. The operating fit is selected to ensure that the body 62 attached to the outer member 14 remains stationary during normal operating conditions.

An impact overcomes the frictional coupling between the two members 14, 16 and causes the body 62 to rotate with the outer member 14 about the axis 12. The proximity sensor 72 transmits the data signal 74 to the computer 70 indicating the initial motion of the now rotating body 62. The computer 70 detects the initial motion of the body 62 from the sensor data and determines that an impact has occurred.

When operating in the first mode, the computer 70 increases the voltage difference applied to the piezoelectric cylinder 20. The cylinder 20 attempts to further expand, and the interference fit at the interface 48 increases. The increased friction force generated at the interface 48 further resists the motion of the movable body 62 and quickly brings the movable body 62 to rest. The computer monitors the deceleration of the movable body and adjusts the voltage difference as needed to ensure that the force bringing the movable body to rest is acceptable.

When operating in the second mode, the computer 70 decreases the voltage difference applied to the piezoelectric cylinder 20. The piezoelectric cylinder radially contracts, with its outer wall 30 moving inwardly from the inner wall 44 of the cylindrical body 18. The interference fit at the interface 48 decreases. The friction force resisting motion of the moving body decreases and the coupling of the two bodies decreases. The moving body can now rotate with less resistance and forces acting on the body are reduced. The computer 70 monitors the deceleration of the movable body 62 via proximity sensor 72 and adjusts the voltage difference as required to ensure that the force braking the movable body is not excessive.

In other embodiments, the control system can respond to other types of trigger events in addition to or instead of impacts. Other sensors or data signals, including manual controls, accelerometers, bar code readers and the like may be used for determining a trigger event to vary the coupling between the two bodies.

Although the coupler 10 includes concentric members that rotate with respect to each other, other embodiments of the present invention could have members that move axially or move with combined axial and rotational movement with respect to each other.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention:

1. A controlled collapse joint for selectively controlling the relative motion of two bodies, the joint comprising:
    an outer member concentrically mounted on an inner member for relative motion about or along an axis;
    the outer member having an inner wall;
    the inner member comprising a piezoelectric cylinder having inner and outer walls, the piezoelectric cylinder being radially deformable in response to a voltage difference between the inner and outer walls of the cylinder;
    the outer member mounted on the piezoelectric cylinder with the inner wall of the outer member and the outer wall of the piezoelectric cylinder engaging each other in an initial interference fit to frictionally couple the inner and outer members and resist relative motion of the two members;
    means for mounting the outer member to a first body;
    means for mounting the inner member to a second body;
    a voltage source having terminals for generating a voltage difference across the terminals;
    first and second electrical connections for applying the voltage difference generated by the voltage source between the inner and outer walls of the piezoelectric cylinder to radially deform the piezoelectric cylinder and thereby vary the interference fit from the initial interference fit to an operating interference fit;
    the first electrical connection electrically connecting one terminal of the voltage source to the outer wall of the piezoelectric cylinder and the second electrical connection connecting the other terminal of the voltage source to the inner wall of the piezoelectric cylinder; and
    a control system operatively connected to the voltage source for selectively setting the voltage difference applied to the piezoelectric cylinder.

2. The controlled collapse joint of claim 1 wherein the voltage difference has a polarity that causes the piezoelectric cylinder to deform radially outwardly.

3. The controlled collapse joint of claim 2 wherein the operating interference fit is greater than the initial interference fit.

4. The controlled collapse joint of claim 1 wherein the outer member is formed from a material that conducts electricity and the outer member forms a portion of the first electrical connection.

5. The controlled collapse joint of claim 4 wherein the interference fit between the outer member and the outer wall of the piezoelectric cylinder electrically connects the inner wall of the outer member with the outer wall of the piezoelectric cylinder.

6. The controlled collapse joint of claim 1 wherein the second electrical connection includes a conductive film adhering to the inner wall of the piezoelectric cylinder.

7. A piezoelectric coupler for coupling two bodies, the coupler comprising:
    a first member having a surface;
    a second member concentric with the first member, the second member comprising a piezoelectric component having inner and outer walls, one of the walls cooperatively engaging the surface of the first member to enable relative motion of the two members on such surface and forming a first interference fit with such surface to frictionally couple the two members;
    means for attaching the first member to a first body and means for attaching the second member to a second body;
    first and second electrical connections for applying a voltage difference between the inner and outer walls of the piezoelectric member, the first electrical connection including a first electrode electrically connected to the one wall of the piezoelectric member and the second electrical connection including a second electrode electrically connected to the other wall of the piezoelectric member;
    whereby when a voltage difference is applied across the two electrodes, the one wall of the piezoelectric member is urged towards or away the surface of the first member and forms a second interference fit with the surface of the first member, the second interference fit being different than the first interference fit to vary the coupling of the two members.

8. The piezoelectric coupler of claim 7 wherein the surface of the first member surrounds and engages the outer wall of the piezoelectric component.

9. The piezoelectric coupler of claim 8 wherein the first member is a conductor of electricity and forms a portion of the first electrical connection.

10. The piezoelectric coupler of claim 8 wherein the second electrical connection includes a conductive member on the inner wall of the piezoelectric component.

11. The piezoelectric coupler of claim 7 wherein the first member is formed from an electrically conductive material and forms a portion of the first electrical connection.

12. The piezoelectric coupler of claim 11 wherein the first electrode is attached to the first member.

13. The piezoelectric coupler of claim 7 wherein the second electrical connection includes a conductive member on the other wall of the piezoelectric component.

14. The piezoelectric coupler of claim 13 wherein the conductive member is a thin film.

15. The piezoelectric coupler of claim 13 wherein the second electrode is attached to the conductive member.

16. The piezoelectric coupler of claim 7 wherein the interference fit between the one wall of the piezoelectric cylinder and the surface of the first member increases in response to an increase in the voltage difference between the first and second electrodes.

17. The piezoelectric coupler of claim 7 wherein the piezoelectric component is a piezoelectric cylinder.

18. The piezoelectric coupler of claim 17 wherein the piezoelectric cylinder is surrounded by the surface of the first member.

19. The piezoelectric coupler of claim 7 including a voltage source having terminals for generating a voltage difference across the terminals, each electrode electrically connected to a different terminal, and a control system operatively connected to the voltage source for selectively setting the voltage difference applied to the piezoelectric component.

20. An apparatus for variably coupling a first body and a second body, the apparatus comprising:

an outer member and an inner member, one of the members defining an axis;

the outer member disposed adjacent the inner member for at least one of: (a) relative translation along the axis with respect to the inner member and (b) relative rotation about the axis with respect to the inner member;

means for attaching the outer member to the first body for conjoint movement of the first body with the outer member;

means for attaching the inner member to the second body for conjoint movement of the second body with the inner member;

one of the inner and outer members comprising a piezoelectric component comprising an inner surface facing towards the axis and an outer surface facing away from the axis;

first and second electrical connections for applying a voltage difference to the piezoelectric component, the first electrical connection electrically connected to the inner surface of the piezoelectric component and the second electrical connection electrically connected to the outer surface of the piezoelectric component whereby a voltage difference across the first and second electrical connections is applied across the inner and outer surfaces of the piezoelectric component and urges the piezoelectric component towards or away from the axis in response to the voltage difference, the piezoelectric component thereby urging the one member towards or away from the other member in response to the voltage difference;

the inner and outer members forming a first interference fit therebetween when a first voltage difference is applied across the piezoelectric component; and the inner and outer members forming a second interference fit therebetween when a second voltage difference is applied across the piezoelectric component, the second voltage difference different than the first voltage difference and the second interference fit different than the first interference fit, whereby the interference fit between the inner and outer members can be increased or decreased to vary the coupling of the first and second bodies.

21. The apparatus of claim 20 wherein at least one of the inner and outer members comprises a tubular portion surrounding the axis.

22. The apparatus of claim 20 comprising control means for varying the interference fit between the inner and outer members in response to the relative motion of the inner and outer members.

23. The apparatus of claim 20 wherein at least one of the inner and outer members comprises an integral electrically conductive portion forming at least a portion of the first or second electrical connection.

* * * * *